United States Patent
Lin et al.

(10) Patent No.: US 11,294,435 B2
(45) Date of Patent: Apr. 5, 2022

(54) INFORMATION HANDLING SYSTEM HIGH DENSITY MOTHERBOARD

(71) Applicant: Dell Products L.P., Round Rock, TX (US)

(72) Inventors: Yong-Teng Lin, Yilan (TW); Jeffrey D. Kane, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 406 days.

(21) Appl. No.: 16/220,712

(22) Filed: Dec. 14, 2018

(65) Prior Publication Data

US 2020/0192439 A1 Jun. 18, 2020

(51) Int. Cl.
*G06F 1/18* (2006.01)
*G06F 1/20* (2006.01)

(52) U.S. Cl.
CPC .............. *G06F 1/189* (2013.01); *G06F 1/181* (2013.01); *G06F 1/184* (2013.01); *G06F 1/203* (2013.01)

(58) Field of Classification Search
None
See application file for complete search history.

(56) References Cited

U.S. PATENT DOCUMENTS

| | | | | |
|---|---|---|---|---|
| 5,164,916 A | * | 11/1992 | Wu ........................ | H05K 1/141 361/679.31 |
| 5,754,406 A | * | 5/1998 | Hardt ...................... | G06F 1/184 361/732 |
| 6,031,721 A | * | 2/2000 | Bhatia ...................... | G06F 1/20 361/679.47 |
| 6,118,654 A | * | 9/2000 | Bhatia ..................... | G06F 1/203 165/104.14 |
| 6,262,883 B1 | * | 7/2001 | Kim ....................... | G06F 1/1658 361/679.09 |
| 6,380,930 B1 | | 4/2002 | Van Ruymbeke | |
| 6,695,634 B1 | * | 2/2004 | Boggs .................... | H01R 12/52 439/329 |

(Continued)

FOREIGN PATENT DOCUMENTS

| | | | | |
|---|---|---|---|---|
| CN | 1961259 B | * | 6/2010 | ............. C30B 29/68 |
| CN | 204425880 U | * | 6/2015 | ............... H05K 7/20 |
| JP | 2009064248 A | * | 3/2009 | ........... G06F 1/1658 |

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.

(Continued)

*Primary Examiner* — Timothy J. Dole
*Assistant Examiner* — Muhammed Azam
(74) *Attorney, Agent, or Firm* — Zagorin Cave LLP; Robert W. Holland

(57) ABSTRACT

An information handling system motherboard integrates components through integrated wirelines, including at least some components coupled to the motherboard on opposite sides of a narrow region, such as formed by an opening that accepts a cooling fan. A bridge circuit board couples to contacts of the motherboard on opposing sides of the narrow region so that wirelines integrated in the bridge circuit board interface motherboard wirelines, thus offering greater communication density across the narrow region.

11 Claims, 6 Drawing Sheets

(56) References Cited

U.S. PATENT DOCUMENTS

| | | | |
|---|---|---|---|
| 6,765,536 B2 | 7/2004 | Phillips et al. | |
| 9,775,229 B1* | 9/2017 | Haley | H05K 3/30 |
| 9,991,616 B2* | 6/2018 | Axelowitz | H05K 3/363 |
| 10,038,262 B1* | 7/2018 | Behziz | H01R 12/7082 |
| 10,367,302 B2* | 7/2019 | Pav | G06F 1/189 |
| 10,481,658 B1* | 11/2019 | Curtis | G06F 1/20 |
| 10,817,082 B1* | 10/2020 | Yildiz | G06F 1/203 |
| 2002/0163779 A1* | 11/2002 | Clidaras | G06F 1/184 |
| | | | 361/679.02 |
| 2002/0165991 A1* | 11/2002 | Clidaras | G06F 1/182 |
| | | | 719/313 |
| 2002/0176237 A1* | 11/2002 | Dow | H05K 1/141 |
| | | | 361/760 |
| 2003/0047348 A1* | 3/2003 | Jessep | H01L 23/49838 |
| | | | 174/250 |
| 2004/0094328 A1* | 5/2004 | Fjelstad | H05K 3/222 |
| | | | 174/251 |
| 2004/0198076 A1* | 10/2004 | Chen | H05K 1/141 |
| | | | 439/65 |
| 2004/0256133 A1* | 12/2004 | Dishongh | H05K 1/0231 |
| | | | 174/541 |
| 2005/0048812 A1* | 3/2005 | Sandoval | H05K 3/301 |
| | | | 439/74 |
| 2006/0171131 A1* | 8/2006 | Chen | H05K 1/141 |
| | | | 361/783 |
| 2008/0022028 A1* | 1/2008 | Yin | G06F 1/185 |
| | | | 710/301 |
| 2008/0028186 A1* | 1/2008 | Casselman | G06F 15/7867 |
| | | | 712/37 |
| 2008/0062065 A1 | 3/2008 | Yamamoto et al. | |
| 2008/0089032 A1* | 4/2008 | Chao | H05K 1/181 |
| | | | 361/720 |
| 2008/0239667 A1* | 10/2008 | Tanaka | H01L 23/427 |
| | | | 361/695 |
| 2008/0318454 A1* | 12/2008 | Wu | H05K 1/0271 |
| | | | 439/84 |
| 2009/0016024 A1* | 1/2009 | Chao | H05K 1/0271 |
| | | | 361/704 |
| 2009/0025962 A1* | 1/2009 | Gelardi | H05K 1/148 |
| | | | 174/254 |
| 2009/0294169 A1* | 12/2009 | Tsubamoto | H05K 3/429 |
| | | | 174/266 |
| 2010/0020479 A1* | 1/2010 | Chen | G06F 1/185 |
| | | | 361/679.4 |
| 2010/0112833 A1* | 5/2010 | Jeon | H05K 1/142 |
| | | | 439/78 |
| 2011/0080710 A1* | 4/2011 | Sugiura | G06F 1/203 |
| | | | 361/697 |
| 2013/0057452 A1* | 3/2013 | Watanabe | H01Q 9/42 |
| | | | 343/905 |
| 2013/0141912 A1* | 6/2013 | Kim | H05K 1/0277 |
| | | | 362/249.02 |
| 2015/0091176 A1* | 4/2015 | Otremba | H01L 24/20 |
| | | | 257/773 |
| 2015/0092380 A1* | 4/2015 | Hohlfeld | H05K 1/11 |
| | | | 361/783 |
| 2015/0349396 A1* | 12/2015 | Aead | H01P 3/08 |
| | | | 333/246 |
| 2016/0007470 A1* | 1/2016 | Standing | H01L 23/13 |
| | | | 361/761 |
| 2016/0043489 A1* | 2/2016 | Coronati | H01L 31/02002 |
| | | | 439/66 |
| 2016/0057546 A1* | 2/2016 | Lyon | H04R 25/00 |
| | | | 381/312 |
| 2016/0128197 A1* | 5/2016 | Standing | H05K 3/32 |
| | | | 361/717 |
| 2016/0372849 A1* | 12/2016 | Hsiao | H05K 3/368 |
| 2017/0318658 A1* | 11/2017 | Martin | H05K 1/0239 |
| 2017/0367180 A1* | 12/2017 | Schriel | H05K 1/181 |
| 2018/0007788 A1* | 1/2018 | Phares | H05K 5/0069 |
| 2018/0070472 A1* | 3/2018 | Aiello | G06F 1/20 |
| 2018/0102338 A1* | 4/2018 | McLellan | H01L 25/0652 |
| 2018/0241859 A1* | 8/2018 | Cho | G06F 1/1626 |
| 2019/0027847 A1* | 1/2019 | Lybrand | H05K 3/368 |
| 2019/0139702 A1* | 5/2019 | Kitamura | H01P 1/32 |
| 2019/0182955 A1* | 6/2019 | Murtagian | H05K 1/141 |
| 2020/0120800 A1* | 4/2020 | Pon | H05K 3/3436 |
| 2020/0192439 A1* | 6/2020 | Lin | G06F 1/189 |
| 2020/0393877 A1* | 12/2020 | Crisp | G06F 1/206 |

OTHER PUBLICATIONS

Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

* cited by examiner

INFORMATION HANDLING SYSTEM HIGH DENSITY MOTHERBOARD

BACKGROUND OF THE INVENTION

Field of the Invention

The present invention relates in general to the field of information handling system circuit boards, and more particularly to an information handling system high density motherboard.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generally integrate a number of integrated circuits and analog components on a motherboard to coordinate information processing. Generally, one or more central processor units (CPUs) each couple to a socket integrated in the motherboard and execute instructions that process the information. CPUs access the instructions and information from memory devices coupled to the motherboard through wirelines formed in the motherboard, such as dynamic random access memory (DRAM) modules and flash memory integrated circuits. Typically, a chipset coupled to the motherboard aids memory and graphics operations by controlling memory and communication links to the CPU and providing a clock as a timing reference. An embedded controller that executes firmware instructions stored in flash memory manages application of power to the CPU and other processing components as well as interfaces with input/output (I/O) devices and peripheral devices. For example, the embedded controller manages a charger and power supply that coordinate power from integrated internal sources, such as a battery, and external sources, such as an AC/DC adapter. A variety of high speed serial links, such as PCMI Express links, and low speed links, such as I2C links, provide communications between the processing components through motherboard wirelines. Many other types of integrated circuit and analog components couple to the motherboard to aid in communication, power distribution, graphics presentation and memory access. For instance, a motherboard may support direct and indirect interfaces with a graphics processing unit (GPU), a solid state drive (SSD), and a variety of capacitors that smooth power distribution during power consumption spikes. As another example, daughter boards and power cables often interface with the motherboard to provide Universal Serial Bus (USB) communication hubs, graphics processing and cooling fan operations.

Generally, a motherboard is a planar printed circuit board that has wirelines integrated in layers of insulation to route between sockets and pin pads that couple to components. In a typical portable information handling system, a motherboard often extends across much of the length and width of the main housing as a convenient and inexpensive medium for interfacing components. Generally, motherboard layers are kept to a minimum and spread around the available area to reduce interference and cross talk while keeping the layout as simple as possible. Increasing the number of wireline layers tends to increase cost and thickness of the motherboard and system. In portable information handling systems that have reduced dimensions to enhance mobile use models, motherboard layout tends to present a number of tradeoffs, especially where integrated circuits have a relatively large surface area and constraints that limit their relative positioning. For instance, bottlenecks that have limited wireline routing area tend to present around major components, such as the CPU, GPU, memory modules and power regulators that supply the system load. To resolve such bottlenecks, tradeoffs include increasing the number of wireline layers or reducing the size and number of supporting subcomponents, such as the battery size, the number of antenna, the cooling fan size, the SSD size and the selection of other components with reduced size and capability.

One option for compressing motherboard layout is to separate some functionality onto separate printed circuit boards that connect to the motherboard with cables or wires. A difficulty with this approach is that the number of pins used in cable or wire interface tend to be limited by soldering techniques used at manufacture. Cables may be used instead that fit into sockets coupled to the motherboard, however, manufacture of non-standardized cable connections tends to increase costs and introduce more opportunity for manufacture errors that decrease manufacture yields. In addition, cable wire connections are generally built in a single row having a pin pitch of at least a minimal size. With larger cable bundles, the X dimension of the connector tends to grow and face failure unless careful consideration is given to strain relief. As cable bundle size increases, forces on solder joints at the motherboard tend to increase, leading to reliability issues as cracked solder disrupts signal transfer. Further, large cable bundles that carry high speed signals tend to suffer losses that limit the length through which high speed signals can travel. Overcoming signal loss often means including circuits to retime or redrive the signals after cable passage.

SUMMARY OF THE INVENTION

Therefore, a need has arisen for a system and method which supports high density motherboard communication at an information handling system.

In accordance with the present invention, a system and method are provided which substantially reduce the disadvantages and problems associated with previous methods and systems that communicate signals through an information handling system motherboard. A bridge printed circuit board couples to a motherboard at a narrow region to increase wireline density in a vertical plane across the motherboard through the narrow region of the motherboard where wireline density is high.

More specifically, a portable information handling system interfaces components through wirelines integrated in a motherboard, such as to provide power, ground, low speed communication links and high speed communication links between components. The motherboard includes one or more narrow regions through which a limited amount of space is available for running the wirelines, such as a narrow region defined by an opening formed in the motherboard to accept a cooling fan that exhausts out one side of the motherboard. At least some wirelines on each side of the narrow region terminate at surface pads of the motherboard on each side of the narrow region to interface with surface pads of a bridge printed circuit board disposed over the narrow region and having integrated wirelines that provide continuity across the narrow region through a vertical plane. In one example embodiment, motherboard wirelines through the narrow region communicate high speed signals that are more subject to loss while bridge circuit board wirelines communicate low speed signals, power and ground that are less susceptible to loss. In another example embodiment, the upper surface of the bridge printed circuit board may interface with a cable connector or directly to a cable to provide cabled connections that further reduce wireline density in the motherboard narrow region.

The present invention provides a number of important technical advantages. One example of an important technical advantage is that communication through an information handling system motherboard bottleneck is supported with a high density interface having stacked printed circuit board structures. A bridge printed circuit board interfaces with the motherboard at opposing sides of a bottleneck area to provide additional surface area for routing wirelines across the bottleneck. Manufacture and assembly is simplified with conductive pads aligned between the bridge printed circuit board and motherboard, which can support pick and place assembly. Signal integrity is enhanced by selecting motherboard versus bridge printed circuit board wirelines to communicate signals based upon signal characteristics and other factors. For instance, high speed signals that are more sensitive to loss transverse the bottleneck through motherboard wirelines while less sensitive signals, such as power, ground and low speed signals proceed through the bridge printed circuit board. Selective vertical expansion based upon motherboard surface area allows the overall motherboard structure to remain simplified with fewer layers while adjusting to support dense signaling needs on an ad hoc basis as a motherboard design adapts to surface area constraints driven by component placement optimizations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system motherboard narrow region increases wireline density with vertical stacking of a bridge printed circuit board to add wirelines in a vertical plane above the narrow region. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
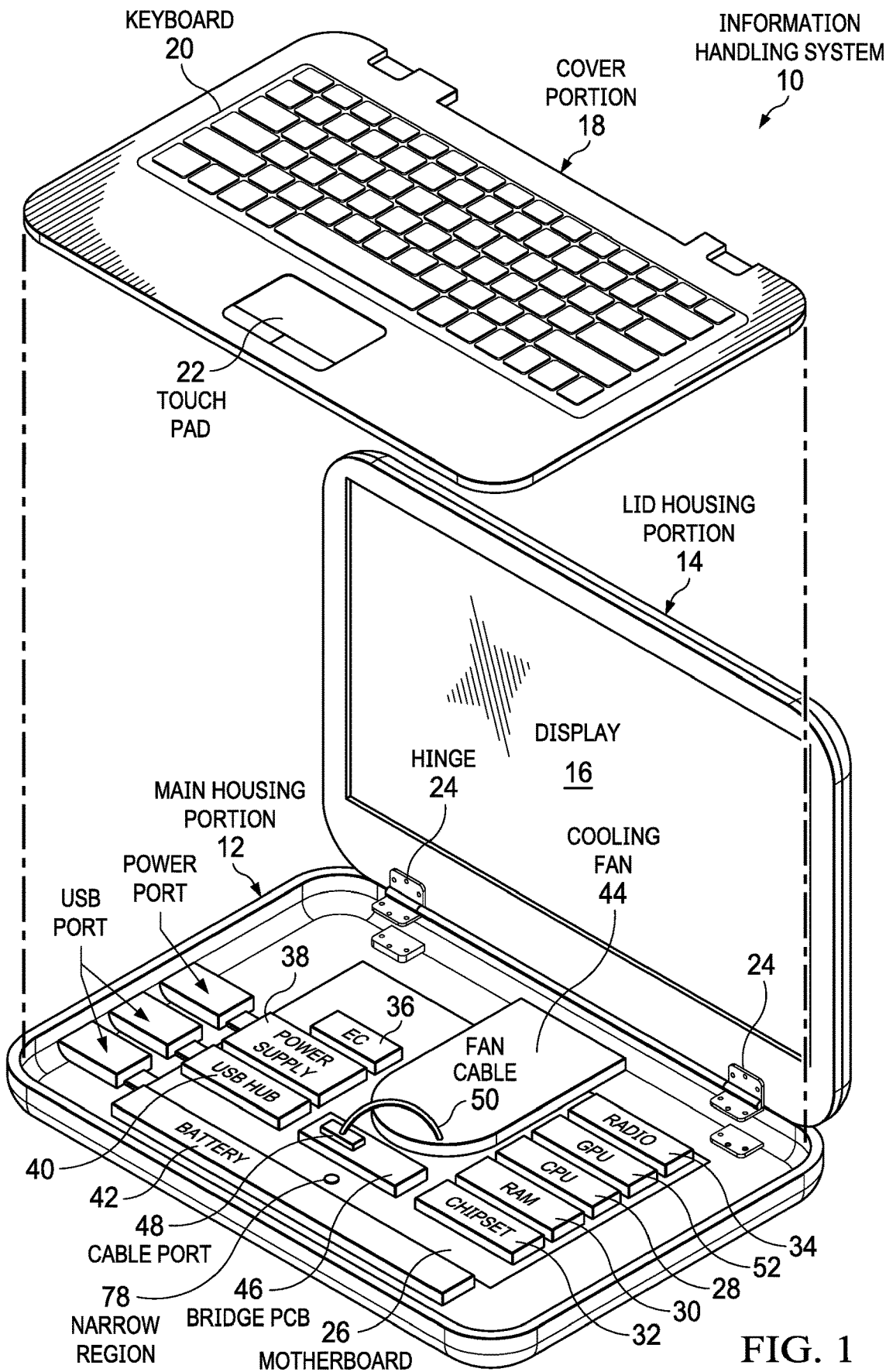
FIG. 1 depicts an exploded view of an information handling system having a bridge printed circuit board to increase communication density of motherboard narrow region.

Referring now to FIG. 1, an exploded view depicts an information handling system 10 having a bridge printed circuit board 46 to increase communication density of a motherboard 26 narrow region 78. Information handling system 10 has a portable configuration with processing components that cooperate to process information disposed in a main housing portion 12 rotationally coupled to a lid housing portion that integrates a display 16 for presenting information as visual images. A cover portion 18 fits over main housing portion 12 with a keyboard 20 and touchpad 22 disposed for accepting end user inputs. For instance, hinges 24 rotate lid housing portion 14 to a vertical orientation over main housing portion 12 so an end user can type inputs while viewing visual images. Motherboard 26 is a printed circuit board that extends across the dimensions of main housing portion 12 and integrates wirelines that provide power, ground and communication links between processing components. Generally, motherboard 26 is the printed circuit board in an information handling system that supports a central processing unit (CPU) 28 coupled to it.

In the example embodiment, motherboard 26 interfaces CPU 28 with random access memory (RAM) 30 and a chipset 32 that communicate through wirelines integrated in motherboard 26 to process information. Although not depicted in the example, a variety of analog components, such as resistors, inductors and capacitors, will also interface through motherboard 26 with CPU 28, RAM 30 and chipset 32 to regulate signal quality and power application at wirelines of motherboard 26. Also coupled to motherboard 26 is an embedded controller 36 that executes firmware instructions to manage power to the processing components and to support interactions with input/output (I/O) devices, such as keyboard 20. A power supply 38 under the management of embedded controller 36 receives power from a power source, such as an external power adapter coupled to a power port or from battery 42, and regulates the power to maintain voltage and current constraints of the processing components. A USB hub 40 couples to motherboard 26 to interface USB ports with CPU 28 and power supply 38, such as to receive power from or provide power to the USB ports.

Briefly, a variety of communication and power transfer protocols may be used to interface processing components through motherboard 26. For example, CPU 28 might use a high speed PCMIe link to exchange information with RAM 30 managed by low speed link of chipset 32, which also provides a high speed pathway for transfer of visual information from RAM 30 to a graphics processor unit (GPU) 52. Many management functions, such as power management by embedded controller 36, are communicated through motherboard 26 with low speed communications links, such as I2C and SMBus links. USB hub 40 manages power and information communication through low and high speed communication links, such CC communications for power transfer, USB 3.0 serial signals for high speed communications and DisplayPort communications for graphics information, including a low speed bi-directional auxiliary link. Similarly, I/O interfaces tend to involve low speed link communications or may also include high speed protocols that support wireless communications through a radio 34, such as with a wireless local area network (WLAN). Motherboard 26 integrates wirelines that communicate signals between various components coupled to motherboard 26.

In the example embodiment, a cooling fan 44 is coupled at a center opening of motherboard 26 and aligned to exhaust out a rear side proximate hinges 24. The central location of cooling fan 44 provides a number of advantages in system design that improves cooling and also wireless communication. However, the opening formed in motherboard 26 to accept cooling fan 44 defines a narrow region 78 between cooling 44 and the front of motherboard 26 opposite the exhaust of cooling fan 44. Narrow region 78 provides a minimal cross section through which wirelines of motherboard 26 may pass. To increase the density of wirelines at narrow region 78, a bridge printed circuit board 46 is coupled to motherboard 26 and interfaced with wirelines of motherboard 26 to increase in a vertical plane the space available for communicating signals including ground and power. In the example embodiment, power and low speed pulse width modulation (PWM) signals are communicated through motherboard 26 to bridge printed circuit board 46 and then at a cable port 48 provided through a fan cable 50 to cooling fan 44. Routing cooling fan control through motherboard 26 to bridge circuit board 46 reduces cable length of fan cable 50, thus reducing manufacture complexity and strain related risks.

Figure 2:
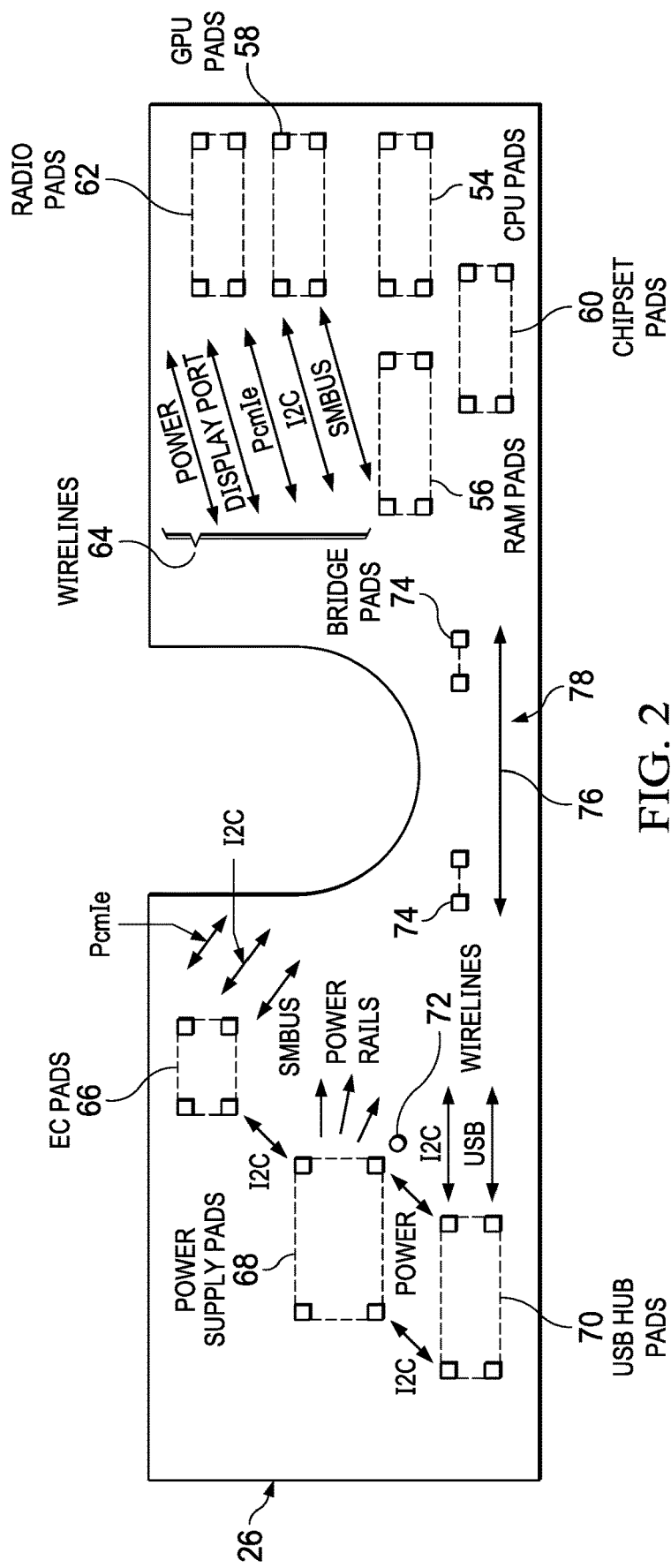
FIG. 2 depicts a top view of a mother board configured to accept components and a bridge circuit board at surface pads.

Referring now to FIG. 2, a top view depicts a motherboard 26 configured to accept components and a bridge circuit board 46 at surface pads. Narrow region 78 is apparent with the removal of cooling fan 44 so that a limited space is available to run wirelines 76 through narrow region 78. On each side of narrow region 78, wirelines indicated generally as arrows interface between surface pads to communicate signals between components. In many instances, components on opposing sides of narrow region 78 will interface through wirelines so that wirelines 76 through narrow region 78 are a limited resource. For instance, CPU surface pads 54 interface with chipset surface pads 60 and RAM surface pads 56 to establish clock control and memory accesses for instructions to execute and information to process. Similarly GPU surface pads 58 interfaces with RAM surface pads 56 and CPU surface pads 54 for control of visual image presentation by an operating system. Communication of processing information generally takes place at high speeds and tend to suffer loss if communicated for greater distances so that these processing components are placed in close proximity for short motherboard 26 wireline lengths. In contrast, radio surface pads 62 interfaces with an antenna so that its placement may depend on antenna placement, which tends to depend on housing layout and access to a transparent wireless pathway. Although shown in proximity to CPU surface pads 54, various physical layout constraints may drive radio placement so that processing high speed signals will travel longer distances through motherboard 26. On the side of narrow region 78 opposite CPU pads 54 embedded controller pads 60 are placed in proximity to power supply pads 68 to control power distribution and battery charging. Similarly USB hub pads 70 are placed near power supply pads 68 as USB is a source of external power. These factors are just examples of what can drive component layout positions on motherboard 26. In a variety of different embodiments, other factors are balanced to achieve efficient component footprints.

Wirelines 64 that integrate in motherboard 26 include a variety of protocols that operate and a variety of clock speeds to perform a variety of functions. Those of skill in the art will recognize that interfaces are generally divided into high speed and low speed interfaces based on the clock speed used to send communication signals. High speed interfaces tend to relate to processing of information by an operating system and/or application for use and/or presentation for an end user. For instance, PCMI Express links provide high speed information transfer that supports processor operations, such as memory accesses. DisplayPort links provide four serial lanes of high speed to communicate pixel values that define visual images at a display and one bi-directional auxiliary link that manages display configuration with lower speeds. USB links send information at high speeds, such as to communicate with external peripherals, while also including low speed links that manage a USB connection and power transfer. High speed signals tend to be susceptible to loss since a receiver has less time to detect each signal rise or fall, however, high speed signals directly impact a user experience by defining the timeliness with which the user has access to the information so that the greater care needed to use high speed signals tends to relate to system performance. Low speed interfaces carry less information but with more robust signal transfer at lower clock speeds. In the example embodiment, I2C and SMBus wirelines are used to manage system interactions rather than end user data, such as adjusting power distribution, changing radio frequencies, reading accelerations, managing display brightness, etc. . . . Power and ground transfer generally have low speed analog considerations that may be impacted by wireline layout but are typically manageable through appropriate analog layouts, such as resistance, capacitance and inductance to manage voltage, current and impedance. As a general guideline, low speed interfaces tend to communicate at clock speeds measured in KHz, such as 100 to 400 KHz for I2C and SMBus links, although some may reach low MHz speeds, such as a higher speed version of I2C at 3.4 MHz. In contrast, high speed links tend to communicate in hundreds of MHz or GHz ranges.

Although careful layout of components on motherboard 26 can limit wireline signal transfer issues, inevitably a number of high speed and low speed signals must transfer across motherboard 26 between conductive surface pads. For instance, in the example embodiment, embedded controller surface pads 66 may interact through high speed and low speed interfaces across motherboard 26 to manage power distribution so that voltage and current of power rails remain within CPU constraints as processing demands fluctuate. As a result, narrow region 78 represents a chokepoint through which a high density of wirelines must pass. To increase the density of wirelines available through narrow region 78, at least some wirelines that have to communicate signals through narrow region 78 terminate at bridge printed circuit board pads 74 disposed on opposing sides of narrow region 78. For instance, bridge printed circuit board pads 74 are disposed in an area of motherboard 26 where adequate room is available to space integrated wirelines so that a bridge printed circuit board 46 may couple to the pads 74 effectively increasing the density of wirelines through narrow region 78.

In various embodiments, wirelines are selected to pass through narrow region 78 through wirelines 76 integrated in motherboard 26 or through wirelines integrated in bridge printed circuit board 46 based upon characteristics of the signals carried by the wirelines. In some instances, wirelines associated with a particular component may be divided vertically and pass through separate circuit board surfaces and materials. For instance, power and ground wirelines tend to have the least susceptibility to noise so that routing through bridge printed circuit board 46 will tend to make sense. Similarly, low speed links like I2C and SMBus tend to resist noise to carry signals in a robust manner so that vertical routing tends to make sense. In contrast, high speed signals that lean on receiver sensitivity to communicate information at high clock speeds may have greater susceptibility to noise if transferred across surface pads so that direct transfer through motherboard 26 wirelines 76 will tend to be more efficient and robust. For instance, USB, PCIe, DisplayPort and other high speed links operating in the GHz range make sense to route through wirelines 76. Even where a particular high speed link routes through motherboard 26 wirelines 76, some portions of the high speed links that communicate at lower speeds may route separately through bridge printed circuit board 46, such as auxiliary, control, power and ground portions. In various embodiments, various design considerations may drive selection of specific routes for various communication links.

Figure 3:
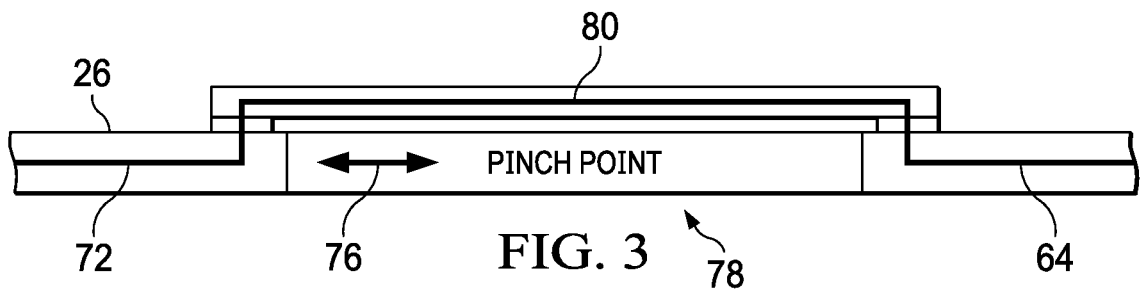
FIG. 3 depicts a side cutaway view of a bridge circuit board coupled over a motherboard.

Referring now to FIG. 3, a side cutaway view depicts a bridge circuit board 46 coupled over a motherboard 26. Some wirelines 72 of motherboard 26 terminate on one side of narrow region 78 with a surface pad that aligns to a surface pad on a bottom surface of bridge printed circuit board 46. Wirelines 80 integrated in bridge printed circuit board 46 carry signals from wirelines 72 across bridge printed circuit board 46 to surface pads that align with wirelines 64 on an opposite side of narrow region 78. Other wirelines 76 of motherboard 26 pass directly through narrow region 78 for improved signal transfer. In the example embodiment, bridge printed circuit board 46 may be placed on motherboard 26 with a pick and place assembly process like a system on module (SOM) or may be built with system in package (SIP) techniques. The upper surface of bridge printed circuit board 46 is covered with an insulative layer and lacks components, although in alternative embodiments described below cable connections and components may be included on the upper surface of bridge printed circuit board 46. Although the example embodiment has a narrow region 78 defined by an opening formed in motherboard 26 to accept a cooling fan, in alternative embodiments, other factors may define a narrow region, include compact placement of components in close proximity to each other.

Figure 4:
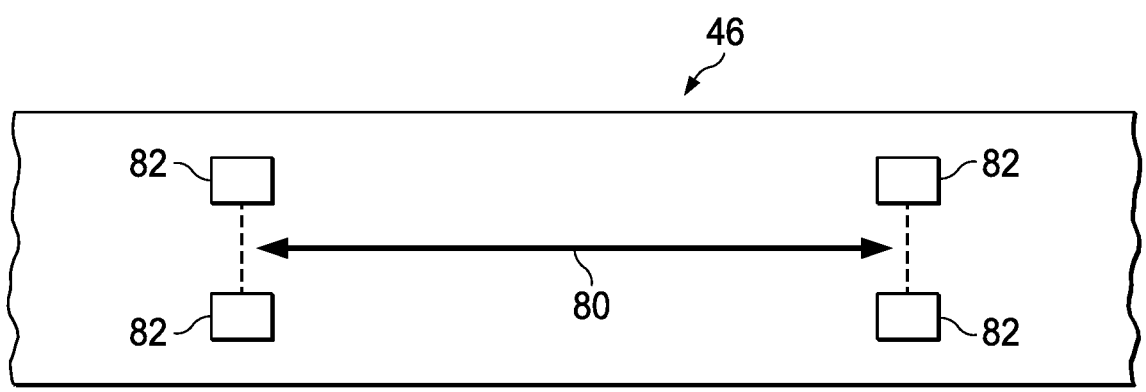
FIG. 4 depicts a bottom view of a bridge circuit board configured with surface pads to couple to a motherboard.

Referring now to FIG. 4, a bottom view depicts a bridge printed circuit board 46 configured with surface pads 82 to couple to a motherboard. Wirelines 80 integrated in bridge printed circuit board 46 communicate signals between pads 82. The material used to create bridge printed circuit board 46 is hard plastic with copper wirelines similar or the same as motherboard 26, although specific materials may be selected based upon the type of signals carried through wirelines 80.

Figure 5:
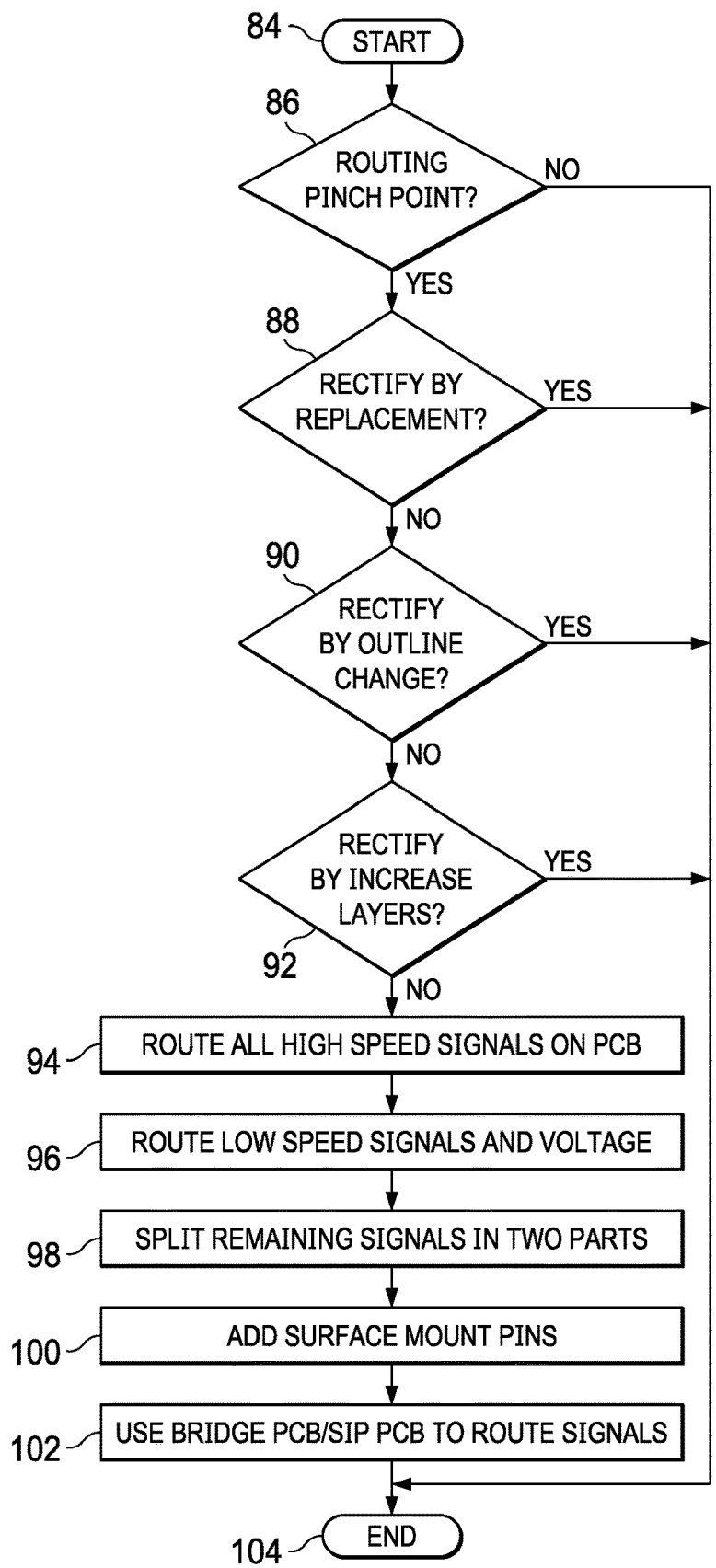
FIG. 5 depicts a flow diagram of a process for selection of a bridge circuit board to increase motherboard wireline density.

Referring now to FIG. 5, a flow diagram depicts a process for selection of a bridge printed circuit board to increase motherboard wireline density. The process starts at step 84 and determines at step 86 if wireline routing through a motherboard has pinch points with high density. If not, the process ends at step 104. If pinch points exist, the process continues to step 88 to determine if the pinch points may be rectified with replacement of the motherboard to have a greater footprint. If replacement of the motherboard is not practical, the process continues to step 90 to determine if the pinch points may be rectified by changing the outline of the motherboard. If an outline change is not practical, the process continues to step 92 to determine if an increase in motherboard thickness is a practical and cost effective option. If not, the process continues to step 94 to define a bridge printed circuit board that will meet the constraints of the system design. At step 94, all high speed signals are routed through the motherboard first to determine what additional wireline capacity is available. At step 96, the remaining space of the motherboard narrow region is used to route low speed signals and power. At step 98, remaining wirelines that will not fit through the narrow region are divided into a second set for routing through the bridge printed circuit board. At step 100, surface mount pads are added to the motherboard to transfer the additional set of signals through bridge printed circuit board wirelines. At step 102, a bridge printed circuit board with surface and or SIP interfaces routes the remaining second set of signals and the process ends at step 104.

Figure 6:
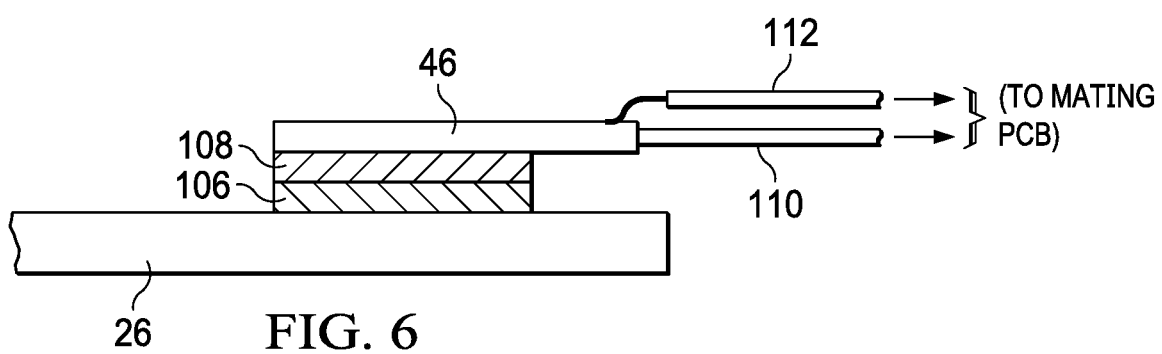
FIG. 6 depicts a side cutaway view of a socket coupling a bridge circuit board to a motherboard.

Referring now to FIG. 6, a side cutaway view depicts a socket 106 coupling a bridge circuit board to a motherboard with a mating connector 108. For example, socket 106 may be a ball grid array that removeably couples bridge printed circuit board 46 to motherboard 26, thus providing more flexible assembly to adapt to different versions of components installed in an information handling system. In the example embodiment, bridge printed circuit board 46 extends wirelines in a flexible manner to a low loss insulator material 112 and a flexible printed circuit board 110. High speed interfaces may be routed through low loss insulator material 112 specific to the type of signal being communicated to allow longer physical routes with acceptable loss in a flexible assembly that, for instance, adapts to different types of components. In contrast, flexible circuit board 110 is essentially a cable that has higher loss acceptable for communication of power and ground.

Figure 7:
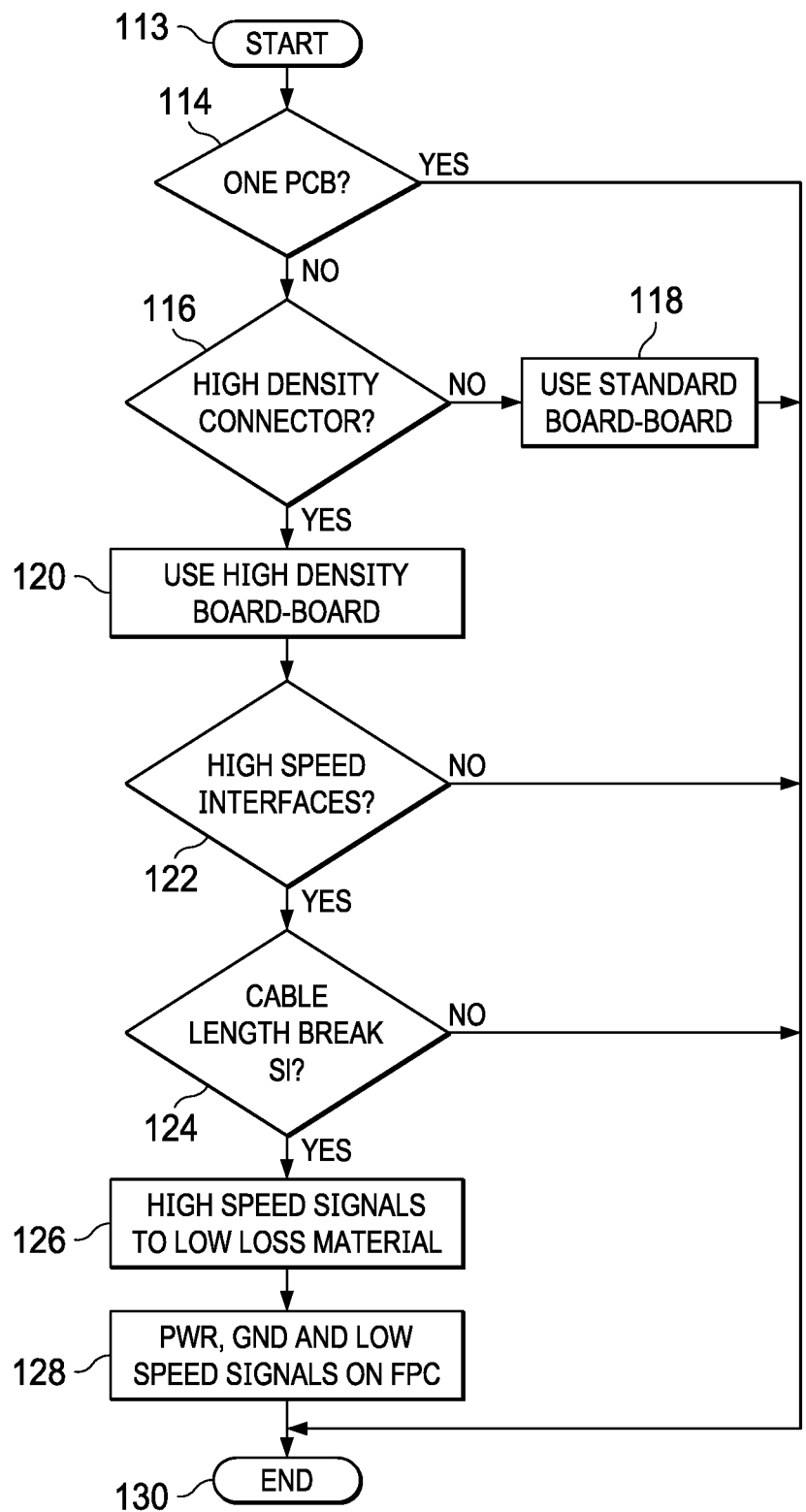
FIG. 7 depicts a flow diagram of a process for selection of dual interface topology coupled to a socket.

Referring now to FIG. 7, a flow diagram depicts a process for selection of a dual interface topology coupled to a socket. The process starts at step 113 and at step 114 a determination is made of whether a single printed circuit board will suffice. If so, the process ends at step 130. If not, the process continues to step 116 to determine if a high density connector is needed to provide adequate communication. If not, the process continues to step 118 to select a standard board to board interface. If at step 116 a high density of wirelines exists, the process continues to step 120 to select a high density circuit board, such as with a narrow region as describe above. At step 122 a determination is made of whether high speed interfaces pass through the narrow region and, if not, the process ends at step 130 using low speed flexible cable connections. If high speed interfaces are determined at step 122, the process continues to step 124 to determine if the cable length involved in communication of the high speed signals call for an enhanced communication medium. If the cable length is sufficiently short, the process ends at step 130. If a break between high and low mediums is desired, the process continues to step 126 to route the high speed signals to low loss material and to step 128 to route power, ground and low speed signals to the higher loss flexible printed circuit cable.

Figure 8:
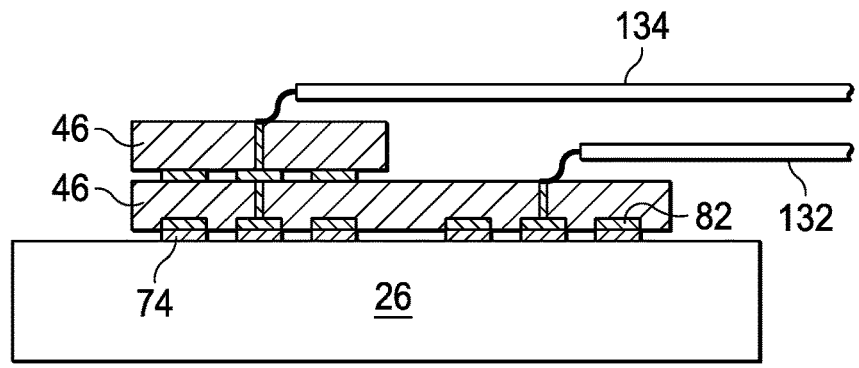
FIG. 8 depicts a side cutaway view of plural bridge circuit boards vertically stacked and supporting multiple cable interfaces.

Referring now to FIG. 8, a side cutaway view depicts plural bridge circuit boards 46 vertically stacked and supporting multiple cable interfaces 132 and 134. Surface pads 74 and 82 align vertically to communicate signals from motherboard 26 to each bridge printed circuit board 46 with the number of vertically stacked printed circuit boards selected based upon the density of wirelines and the surface area on the upper surface of bridge circuit boards 46 desired to provide cable or other connectors. Breaking cable connections into separate bundles provides greater manufacturing flexibility, such as to use hot bar connections that become less reliable as cable bundle size increases. Routing cable connections closer to dense wireline areas provides simplified interfaces with reduced cable lengths are greater interface reliability. For instance, strain relief presents less difficulty as does signal loss across a cable. In addition to supporting cables on both sides of a narrow regions, bridge circuit board 46 may also provide wirelines through itself to increase wireline density as describe above.

Figure 9:
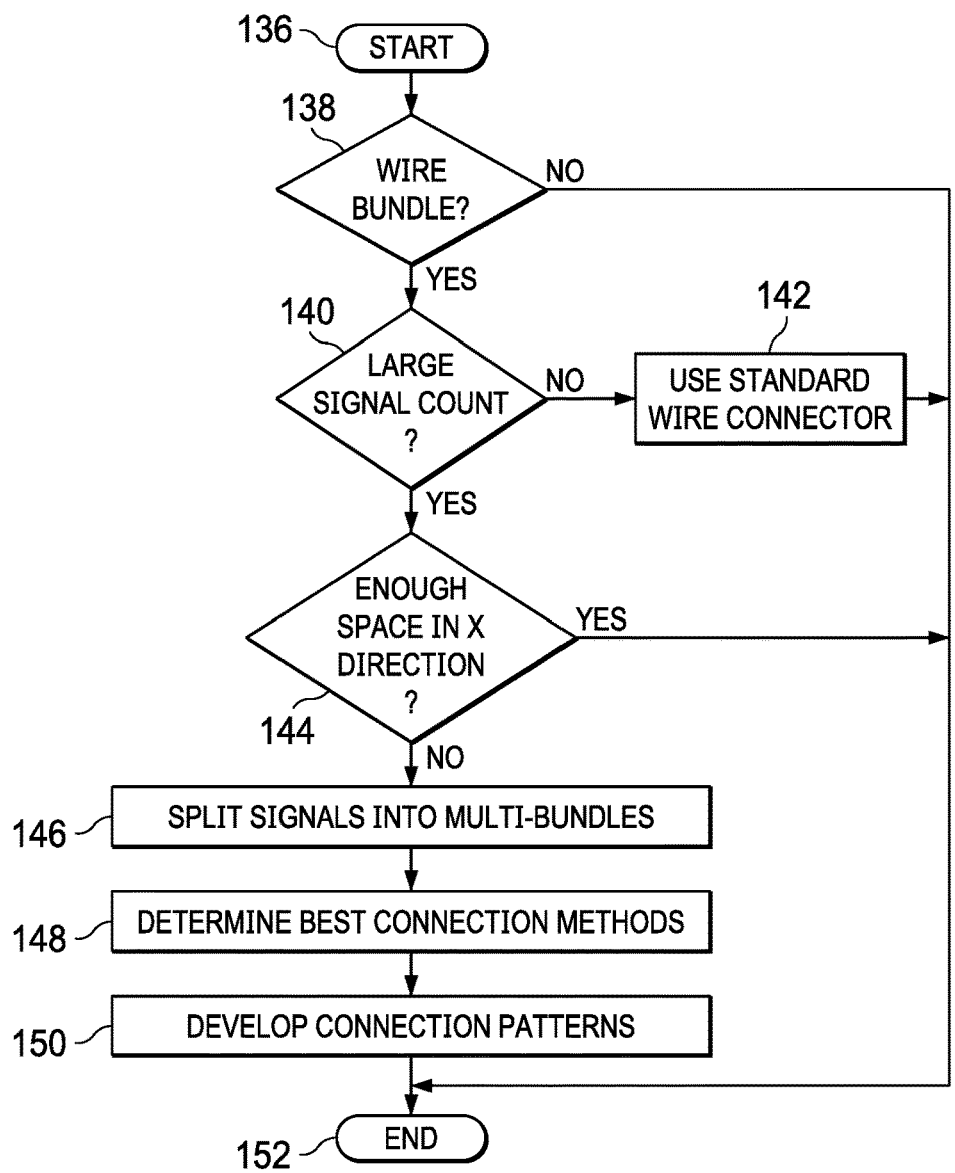
FIG. 9 depicts a flow diagram of a process for selection of vertically stacked bridge circuit boards to increase wireline density at a motherboard narrow region.

Referring now to FIG. 9, a flow diagram depicts a process for selection of vertically stacked bridge circuit boards to increase wireline density at a motherboard narrow region. The process starts at step 136 and continues to step 138 to determine if a wire bundle is desired in the system. If not, the process ends at step 152. If a wire bundle is desired, the process continues to step 140 to determine if the wire bundle has a large size, i.e., a large signal count. If a standard wire bundle will suffice, the process continues to step 142 and ends at step 152. If a large wire bundle is involved, the process continues to step 144 to determine if sufficient space exists to support the large wire bundle in the desired direction. If sufficient room exists, the process ends at step 152 with a motherboard cable mount. If space constraints do not support a single large bundle, the process continues to step 146 to split the signals into multiple bundles. At step 148, the signals are divided into two or more wire bundles that provide adequate cable transmission characteristics. For example, interfaces that might cross talk or otherwise interfere with each other are divided into separate wire bundles. At step 150, each bridge printed circuit board is assigned compatible signals and connection patterns are defined, such as by defining a cable connection for each vertically stacked bridge printed circuit board. The process ends at step 152.

Although the present invention has been described in detail, it should be understood that various changes, substitutions and alterations can be made hereto without departing from the spirit and scope of the invention as defined by the appended claims.

What is claimed is:

1. An information handling system comprising:
    a portable housing;
    processing components operable to cooperate to process information;
    a motherboard coupled to the portable housing and integrating wirelines that interface signals between the processing components, the processing components coupled to the motherboard, the motherboard having an opening that defines a narrow region, and at least some of the wirelines passing through the narrow region;
    a first set of plural pads disposed at an upper surface of the motherboard and interfaced with a first set of the wirelines at a first side of the narrow region;
    a second set of plural pads disposed at the upper surface of the motherboard and interfaced with a second set of the wirelines at a second side of the narrow region; and
    a bridge printed circuit board having a third set of plural pads disposed at a lower surface on one side and a fourth set of plural pads disposed at the lower surface on an opposing side, the bridge printed circuit board integrating wirelines that interface the third and fourth set of plural pads;
    wherein the bridge printed circuit board couples to the motherboard to align the first set of plural pads with the third set of plural pads and to align the second set of plural pads with the fourth set of plural pads, the bridge printed circuit board routing at least some of the signals of the motherboard across the narrow region; and
    wherein at least some of the motherboard wirelines directly interface a first of the processing components coupled to a first side of the narrow region with a second of the processing components coupled to a second side of the narrow region through a high speed link of the at least some of the wirelines passing through the narrow region and a low speed link of the bridge printed circuit board wirelines.

2. The information handling system of claim 1 further comprising:
    a cooling fan coupled to the motherboard in the opening and aligned to exhaust at one side of the motherboard, the narrow region opposite the exhaust;
    wherein at least some of the processing components couple to the motherboard on opposite sides of the cooling fan and interface at least some of the signals through the bridge circuit board.

3. The information handling system of claim 2 wherein the bridge circuit board upper circuit has an insulating layer without any components.

4. The information handling system of claim 2 wherein the motherboard wirelines communicate signals between first and second of the plural processing components through the narrow region, the signals including high speed signals and low speed signals, the high speed signals routed through the motherboard wirelines passing through the narrow region, the low speed signals routed through the bridge printed circuit board wirelines.

5. The information handling system of claim 2 wherein the motherboard wirelines communicate signals and power between first and second of the processing components through the narrow region, the signals routed through the motherboard wirelines passing through the narrow region, the power routed through the bridge printed circuit board wirelines.

6. The information handling system of claim 2 further comprising:
a ball grid array socket coupled to the motherboard to interface with the first and second sets of plural pads;
wherein the bridge printed circuit board couples to the ball grid array socket to interface the third set of plural pads to the first set of plural pads and the fourth set of plural pads to the second set of plural pads.

7. The information handling system of claim 2 further comprising:
a fifth set of plural pads disposed at an upper surface of the bridge printed circuit board and interfaced through the bridge printed circuit board with the first set of plural pads; and
a cable connector coupled to the fifth set of plural pads.

8. The information handling system of claim 7 further comprising a cable coupled to the cable connector at a first end of the cable and to the motherboard at an opposing second end of the cable.

9. The information handling system of claim 1 further comprising:
a fifth set of plural pads disposed at an upper surface of the bridge printed circuit board and interfaced through the bridge printed circuit board with the first set of plural pads; and
a second bridge printed circuit board having a sixth set of plural pads disposed on a lower surface of the second bridge printed circuit board, the fifth and sixth sets of plural pads aligned to communicate the signals from the motherboard to the second bridge printed circuit board.

10. A motherboard comprising:
an insulating material integrating plural motherboard wirelines and forming an opening that defines a narrow region;
a first set of contacts exposed at an upper surface of the insulating material on a first side of the narrow region, at least some of the first set of contacts interfacing with the plural motherboard wirelines;
a second set of contacts exposed at the upper surface of the insulating material on a second side of the narrow region, at least some of the second set of contacts interfacing with the plural motherboard wirelines; and
a bridge printed circuit board integrating plural bridge wirelines terminating at a third set of contacts exposed at opposing sides of the bridge printed circuit board;
a component coupled to the at least some of the first set of contacts and communicating through at least a first wireline with a high speed link and a second wireline with a low speed link;
wherein the bridge printed circuit board third set of contacts couple to at least some of the first and second set of contacts to interface the plural motherboard wirelines located between the first and second sides of the narrow region through the bridge wirelines integrated in the bridge printed circuit board;
wherein at least some of the plural motherboard wirelines directly interface contacts of the first and second set of contacts through the narrow region;
wherein the high speed link communicates through the plural motherboard wirelines through the narrow region; and
wherein the low speed link communicates through the plural bridge wirelines.

11. The motherboard of claim 10 further comprising a cable connector coupled to the bridge printed circuit board and interfaced with the plural bridge wirelines.

* * * * *